United States Patent
Cho

(10) Patent No.: US 11,296,086 B2
(45) Date of Patent: Apr. 5, 2022

(54) FEEDBACK 1T DRAM DEVICE HAVING LOCALIZED PARTIAL INSULATING LAYERS

(71) Applicant: Gachon University of Industry-Academic cooperation Foundation

(72) Inventor: Seongjae Cho, Seoul (KR)

(73) Assignee: Gachon Univ. of Industry-Academic Co-op Foundation, Seongnam-si (KR)

(*) Notice: Subject to any disclaimer, the term of this patent is extended or adjusted under 35 U.S.C. 154(b) by 51 days.

(21) Appl. No.: 16/726,506

(22) Filed: Dec. 24, 2019

(65) Prior Publication Data
US 2021/0066299 A1 Mar. 4, 2021

(30) Foreign Application Priority Data

Aug. 27, 2019 (KR) .................. 10-2019-0105435

(51) Int. Cl.
*H01L 27/108* (2006.01)
*H01L 29/78* (2006.01)

(52) U.S. Cl.
CPC .. *H01L 27/10802* (2013.01); *H01L 27/10805* (2013.01); *H01L 27/10847* (2013.01); *H01L 29/7841* (2013.01)

(58) Field of Classification Search
CPC ......... H01L 27/10802; H01L 27/10805; H01L 27/10847; H01L 29/7841

USPC .......................................... 257/390; 365/149
See application file for complete search history.

(56) References Cited

U.S. PATENT DOCUMENTS

| 9,356,236 | B2* | 5/2016 | Park | H01L 27/2436 |
| 2006/0033128 | A1* | 2/2006 | Chi | H01L 21/84 |
| | | | | 257/279 |
| 2013/0100729 | A1* | 4/2013 | Wan | H01L 27/1203 |
| | | | | 365/149 |
| 2013/0314986 | A1* | 11/2013 | Nemati | H01L 27/0817 |
| | | | | 365/180 |
| 2015/0200005 | A1* | 7/2015 | Han | G11C 15/04 |
| | | | | 365/49.11 |

FOREIGN PATENT DOCUMENTS

KR 10-1896759 9/2018

* cited by examiner

*Primary Examiner* — David Vu
*Assistant Examiner* — Brandon C Fox
(74) *Attorney, Agent, or Firm* — Gerald E. Hespos; Michael J. Porco; Matthew T. Hespos

(57) ABSTRACT

A feedback 1T DRAM device that has a partial insulating film structure is provided. A body region may be divided into two or more in a channel direction by pn junctions and/or partial insulating layers, and gates may be formed on each of the divided body regions. The present invention can be operated by filling and subtracting electrons in the energy well of the conduction band and holes in the energy well of the valence band, respectively. In addition, it is possible to maximize retention time and improve operation reliability by reducing carrier loss by energy barriers of pn junctions and/or partial insulating layers.

17 Claims, 4 Drawing Sheets

| | |
|---|---|
| Gate length ($L_{G1}$, $L_{G2}$) | 500 nm |
| Source/Drain length ($L_S$, $L_D$) | 50 nm |
| Body thickness ($T_{body}$) | 22 nm |
| Oxide thickness ($T_{ox}$) | 3 nm |
| Barrier length ($L_{barrier}$) | 8 nm |
| Barrier thickness ($T_{barrier}$) | 10 nm |
| Source doping concentration (p-type) | $10^{20}$ cm$^{-3}$ |
| Body doping concentration (p-type) | $10^{15}$ cm$^{-3}$ |
| Drain doping concentration (n-type) | $10^{20}$ cm$^{-3}$ |

|  | $V_{G1}$ [V] | $V_{G2}$ [V] | $V_D$ [V] | Time [ns] |
|---|---|---|---|---|
| Program | 0.0 | 0.0 | 1.2 | 200 |
| Erase | 0.7 | -0.7 | 0.0 | 200 |
| Read | -0.45 | 0.45 | 1.2 | 200 |
| Hold | -0.45 | 0.45 | 0.0 | 1000 |

FEEDBACK 1T DRAM DEVICE HAVING LOCALIZED PARTIAL INSULATING LAYERS

CROSS-REFERENCE TO RELATED APPLICATION

This application claims priority to Korean Patent Application No. 10-2019-0105435, filed on Aug. 27, 2019, under 35 U.S.C. 119, the entire contents of which are hereby incorporated by reference. by reference.

BACKGROUND

Field of the Invention

The present invention relates to a dynamic random access memory (DRAM) device, and more particularly to a feedback 1T DRAM device having a partial insulating film structure.

Related Art

DRAM is a typical volatile memory, which has advantages of high operating speed and high integration and serves as a main memory device in computers and electronic systems. The electrons or holes are stored to have a memory characteristic, and as time passes, the electrons or holes are dissipated, and thus a periodic refresh operation is required. In general, DRAM has a structure consisting of one transistor and one capacitor (1T1C structure) but may have a 1T DRAM structure in which capacitors are removed to further improve integration and secure a stacking possibility. In 1T DRAM, electron-hole pairs are generated by a high-energy carrier collision or an interband tunneling operation near the drain region. At this time, it is possible to distinguish digital data 0 and 1 through the difference in read currents generated by changing the threshold voltage of the transistor through the carriers stored in the body region.

In many cases, 1T DRAM devices are based on MOSFET transistors fabricated on silicon-on-insulator (SOI) substrates. However, in the case of MOSFET transistors, when the current flows between the source and the drain by the gate voltage, there is a limit to the current slope (i.e., Subthreshold Swing) in a subthreshold voltage due to the heat dissipation mechanism. Among those proposed to overcome the switching limit of the MOSFET transistors, there is a positive feedback field-effect transistor (FB-FET) having a double gate and p-i-n structure as disclosed in Korean Patent No. 10-1896759, or a thyristor DRAM (TRAM).

The patent has two gates in an intrinsic region to electrically form an energy barrier to operate by confining (storing) electrons in an energy well of the conduction band and holes in an energy well of the valence band, respectively. Therefore, there is a problem in that a hold voltage should always be applied.

The patent has two gates in an intrinsic region and electrically form an energy barrier to be operated by confining (i.e., storing) electrons in the energy well of the conduction band and holes in the energy well of the valence band, respectively. There is a problem that a hold voltage should always be applied. germanium shell.

SUMMARY

The present invention provides a feedback 1T DRAM having a partial insulating layer to maximize retention time and improve operation reliability by reducing carriers lost beyond the energy barrier due to p-n junction even in a p-n-p-n structure by impurity doping.

To achieve the objectives, a 1T DRAM device according to an embodiment of the present invention comprises source and drain regions; a body region having two or more doped semiconductor layers connected by a pn junction in a channel direction between the source and drain regions; and a plurality of gates formed on each of the doped semiconductor layers with a gate insulating layer interposed therebetween.

The source region, the body region and the drain region may be connected by at least three pn junctions along the channel direction.

The plurality of gates may surround the doped semiconductor layers of the body region.

The plurality of gates may be placed electrically independent at both ends of each of the doped semiconductor layer of the body region.

The body region may be further comprised of a body partial insulating layer allowing only a portion of the pn junction between the doped semiconductor layers.

A source partial insulating layer and a drain partial insulating layer may be further formed between the source region and the body region and between the body region and the drain region, respectively, allowing only partial pn junctions.

The source region, the body region and the drain region may be silicon, and the source partial insulating layer, the body partial insulating layer, and the drain partial insulating layer may be a silicon oxide film having a thickness of 10 nm.

A 1T DRAM device according to another embodiment of the present invention comprises source and drain regions; two or more body regions separated by a body partial insulating layer along a channel direction between the source and drain regions; and a plurality of gates formed on each of the separated body regions, respectively with a gate insulating layer interposed therebetween.

A source partial insulating layer and a drain partial insulating layer may be further formed between the source region and the body region and between the body region and the drain region, respectively.

The source region may be a doped semiconductor layer of a first conductivity type, the drain region may be a doped semiconductor layer of a second conductivity type opposite to the source region, and the body region may be an intrinsic semiconductor layer or a doped semiconductor layer of the same conductivity type as the drain region.

The plurality of gates may surround each of the separated body regions.

Among the plurality of gates, a source side gate adjacent to the source region may be doped with impurities of the same type as the drain region, and a drain side gate adjacent to the drain region may be doped with impurities of the same type as the source region.

In the present invention, a body region may be divided into two or more in a channel direction by pn junctions and/or partial insulating layers, and gates may be formed on each of the divided body regions. The present invention can be operated by filling and subtracting electrons in the energy well of the conduction band and holes in the energy well of the valence band, respectively. In addition, it is possible to maximize retention time and improve operation reliability by reducing carrier loss by energy barriers of pn junctions and/or partial insulating layers.

In these drawings, the following reference numbers are used throughout: reference number 10 indicates a source region, 20 a drain region, 30 a body region, 40 a source partial insulating layer, 50 a body partial insulating layer, 60 a drain partial insulating layer, 72 and 74 gate insulating layers, 82 and 84 an isolation insulating layer, and 92, 94, 96 and 98 gates.

DETAILED DESCRIPTION

Detailed descriptions of preferred embodiments of the present invention are provided below with accompanying drawings.

Figure 1:
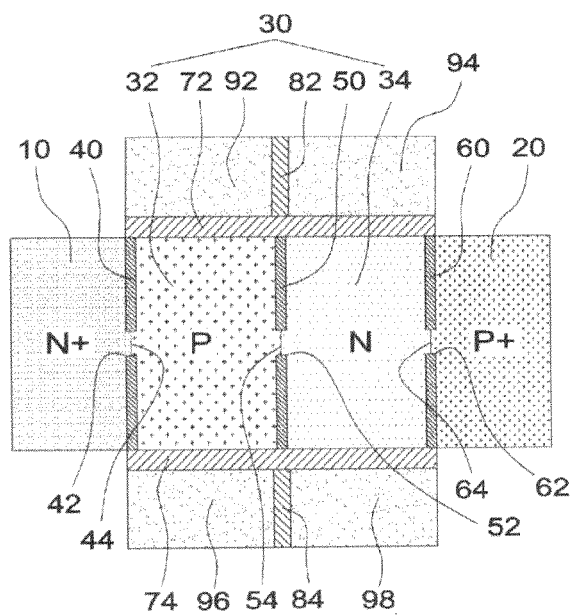
FIG. 1 is a structural cross-sectional view of a 1T DRAM device according to an embodiment of the present invention.

A 1T DRAM device according to an embodiment of the present invention, as shown in FIG. 1, comprises source region 10 and drain region 20; a body region 30 having two or more doped semiconductor layers 32 and 34 connected by a pn junction 54 in a channel direction between the source and drain regions 10 and 20; and a plurality of gates 92, 94, 96, and 98 formed on each of the doped semiconductor layers with a gate insulating layer 72 or 74 interposed therebetween.

In the above embodiment, a source partial insulating layer 40, a body partial insulating layer 50, and a drain partial insulating layer 60 which will be described later with reference to FIG. 1 are absent. In FIG. 1, the source region 10 is an N+ doped layer as a first conductivity type semiconductor layer, and the body region 30 consist of a P doped layer 32 which is a second conductivity type opposite to the source region 10 and an N-type doped layer 34. And the drain region 20 is shown as a P+ doped layer. However, it is not limited thereto. Herein, the N+ doped layer is more highly doped with impurities than the N-type doped layer and the P+ doped layer is more highly doped than the P-type doped layer.

In some embodiments, the source region 10 and the drain region 20 may be formed of a conductive material layer other than the doped semiconductor layer. The active region including the source region 10 and the drain region 20 may have various pn junction structures depending on the degree of partition and extension of the body region 30.

FIG. 1 shows that the source region 10, the body region 30, and the drain region 20 may be connected to three pn junctions 44, 54, and 64 as an n-p-n-p structure along the channel direction. In addition, it may have a structure of the active region in which the doped semiconductor layers having an opposite type are continuously pasted through pn junctions from the source region 10. That is, the active region may have an extended structure through pn junctions from the source region 10, such as four pn junctions in an n-p-n-p-n structure or five pn junctions in an n-p-n-p-n-p structure, etc.

The source region 10 may be formed of a P+ doped layer according to the operation of the device. Therefore, the active region may have a structure extended from the P+ doping layer as a p-n-p-n structure or the like.

A plurality of gates 92, 94, 96, and 98 may be provided on each of the doped semiconductor layers 32 and 34 constituting the body region 30 with the gate insulating layers 72 and 74 interposed therebetween. The plurality of gates 92, 94, 96, and 98 may be formed to surround the doped semiconductor layers 32 and 34 of the body region 30 in one embodiment. That is, as shown in FIG. 1, some gates 92 and 96 of the plurality of gates 92, 94, 96, and 98 may wrap a P doped layer 32 integrally, and the remaining gates 94 and 98 may wrap an N doped layer 34 integrally. The two gates which surround the P doped layer 32 and the N doped layer 34, respectively are isolated by separation insulating layers 82 and 84. In FIGS. 1, 92 and 94 are one of the two gates and 96 and 98 are the other one. In this case, the gate insulating layers 72 and 74 may also have a structure surrounding the P doped layer 32 and the N doped layer 34. Thus, the body region 30 can be electrically isolated from the outside by the gate insulating layers 72 and 74.

In another embodiment, the plurality of gates 92, 94, 96, and 98 may be electrically independently formed on both ends of each of the doped semiconductor layers 32 and 34 of the body region 30, as shown in FIG. 1. Here, the both ends include two points spaced at a random distance on each of the doped semiconductor layers 32 and 34. In this case, the body region 30 may be provided to be electrically isolated from the outside by the gate insulating layers 72 and 74, and the plurality of gates 92, 94, 96 and 98 may be isolated by the isolation insulating layers 82 and 84.

In an application of the above-described embodiment, the body region 30 may be implemented by further forming a body partial insulating layer 50 allowing a partial pn junction 54 between the doped semiconductor layers 32 and 34. Here, the partial pn junction 54 is formed only at an opening 52 of the body partial insulating layer 50 between the doped semiconductor layers 32 and 34 as shown in FIG. 1.

Furthermore, a source partial insulating layer 40 and a drain partial insulating layer 60 may be further formed between the source region 10 and the body region 30 and between the body region 30 and the drain region 20, respectively, allowing only partial pn junctions 44 and 64. Here, the partial pn junctions 44 and 64 are also formed only at openings 42 and 62 of the source partial insulating layer 40 and the drain partial insulating layer 60.

In the body partial insulating layer 50, the source partial insulating layer 40, and the drain partial insulating layer 60, the term 'partial insulating layer' means an insulating layer formed at a portion except for openings 42, 52 and 62 in the junctions as shown in FIG. 1. The pn junctions remain only in the openings 42, 52 and 62 at the pn junction surface as the partial pn junctions 44, 54 and 64.

The body partial insulating layer 50, the source partial insulating layer 40, and the drain partial insulating layer 60 are not limited to the shapes shown in FIG. 1. But referring to embodiments related with FIGS. 3 to 6 to be described later, it is preferable to have the openings 42, 52 and 62 in the form of a circle or polygon in the center of each pn junction surface. When the width of the partial insulating layers 40, 50 and 60 surrounding the openings 42, 52 and 62, that is, the length $L_{barrier}$ of the energy barrier by the partial insulating layers is 8 nm, the size of the openings 42, 52 and 62 may be 6 nm. Thus, it is preferable to form the source partial insulating layer 40, the body partial insulating layer 50, and the drain partial insulating layer 60 to have this ratio.

In a more specific embodiment, the source region 10, the body region 30, and the drain region 20 may be silicon. The source partial insulating layer 40, the body partial insulating layer 50, and the drain partial insulating layer 60 may be a silicon oxide film and have a thickness of 10 nm.

Figure 2A:
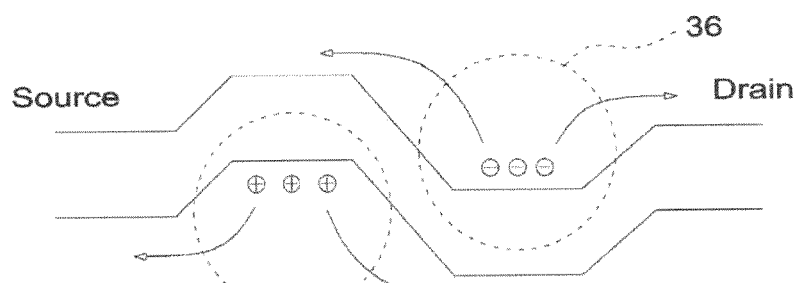
FIGS. 2A and 2B are a conceptual diagram illustrating an energy band formed in a channel direction and a carrier leakage when a source partial insulating layer, a body partial insulating layer, and a drain partial insulating layer are not formed and are formed, respectively in FIG. 1.

FIG. 2A illustrates an energy band of source region 10 up to drain region 20 through body region 30 in the embodiment where the source partial insulating layer 40, the body partial insulating layer 50, and the drain partial insulating layer 60 are not present in FIG. 1. Referring to FIG. 2A, by the pn junctions 44, 54, and 64 of the source region 10, the plurality of doped layers 32 and 34 of the body region 30, and the drain region 20, one or more energy wells 36 are formed in a conduction band of the body region 30 to store electrons, and one or more energy wells 38 are formed in a valence band to store holes. By providing gates 92, 96, 94 and 98 on the plurality of doped layers 32 and 34 of the divided body region 30, it can be operated by filling and subtracting electrons in the energy well of the conduction band and holes in the energy well of the valence band, respectively.

In the embodiment of FIG. 2A, carriers (i.e., electrons or holes) are stored only by energy barriers due to the pn junctions 44, 54 and 64 in the body region 30. Thus, when the device is used in a high ambient temperature environment, electrons or holes stored in each of the wells 36 and 38 may flow out of the energy barriers toward the source or the drain.

Figure 2B:
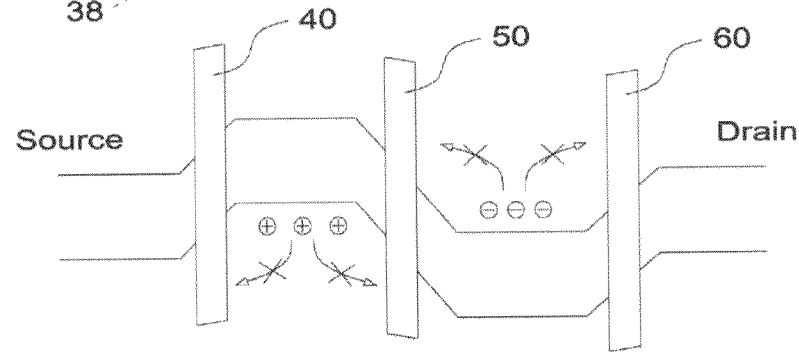

Meanwhile, FIG. 2B illustrates an energy band from the source 10 to the drain region 20 in the embodiment where the source partial insulating layer 40, the body partial insulating layer 50, and the drain partial insulating layer 60 are present as shown in FIG. 1. According to this, as shown in FIG. 2B, high energy barriers due to the partial insulating layers 40, 50 and 60 are further formed between and adjacent to an electron well 36 of the conduction band formed by the pn junctions 44, 54 and 64 and a hole well 38 of the valence band. Thus, it is possible to fundamentally solve the problem mentioned in the embodiment of FIG. 2A, that is, the problem that electrons or holes stored in each of the wells 36 and 38 flow out toward the source or drain in a high temperature environment. As a result, the retention time of the DRAM device can be maximized, and operation reliability can be further improved.

Figures 3, 4:
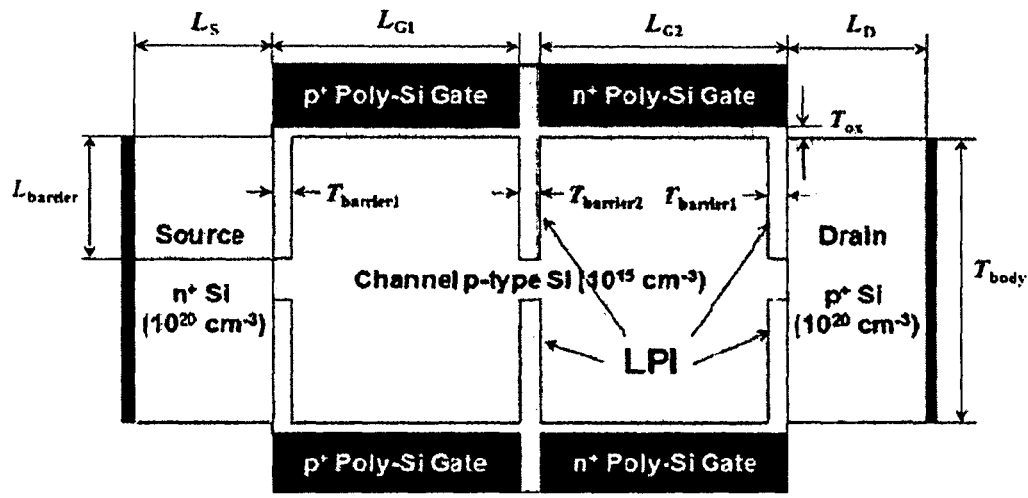
FIG. 3 is a structural cross-sectional view for electrically simulating a 1T DRAM device according to another embodiment of the present invention.
FIG. 4 is a table exemplarily showing dimensions of respective components shown in FIG. 3.

A 1T DRAM device according to another embodiment of the present invention, as shown in FIG. 3, comprises source and drain regions; two or more body regions separated by a body partial insulating layer along a channel direction between the source and drain regions; and a plurality of gates formed on each of the separated body regions, respectively with a gate insulating layer interposed therebetween.

In FIG. 3, the source region is n-type silicon, the drain region and the body region are p-type silicon but is not limited thereto. That is, the source region may be a first conductivity type semiconductor layer, the drain region may be a second conductivity type semiconductor layer having a type opposite to the source region, and the body region may be an intrinsic semiconductor or a second conductivity type semiconductor layer of the same type as the drain region.

In the active region doped as shown in FIG. 3, when the body region is separated into three or more body portion insulating layers, it may be implemented without a source portion insulating layer and a drain portion insulating layer. But when the body region is separated into two, it is preferable that a drain partial insulating layer is further provided between the body region and the drain region.

Furthermore, as shown in FIG. 3, it is preferable that a source partial insulating layer is further provided between the source region and the body region.

The plurality of gates may be formed to surround each of the separated body regions, as shown in FIG. 3, but may be formed to be electrically independent at both ends of each of the separated body regions, as shown in FIG. 1.

In addition, a gate adjacent to the source region among the plurality of gates may be doped with a dopant of the same type as the drain region. In the same way, a gate adjacent to the drain region among the plurality of gates may be doped with a dopant of the same type as the source region. For example, when the source region is n-type silicon and the drain region is p-type silicon, the gates adjacent to the source and drain regions may be a p-type poly silicon gate and a n-type poly silicon gate, respectively as shown in FIG. 3.

FIG. 3 is a cross-sectional view illustrating a structure for electrically simulating a 1T DRAM device according to another embodiment of the present invention, and FIG. 4 is a table showing dimensions of respective components shown in FIG. 3.

Figures 5, 6:
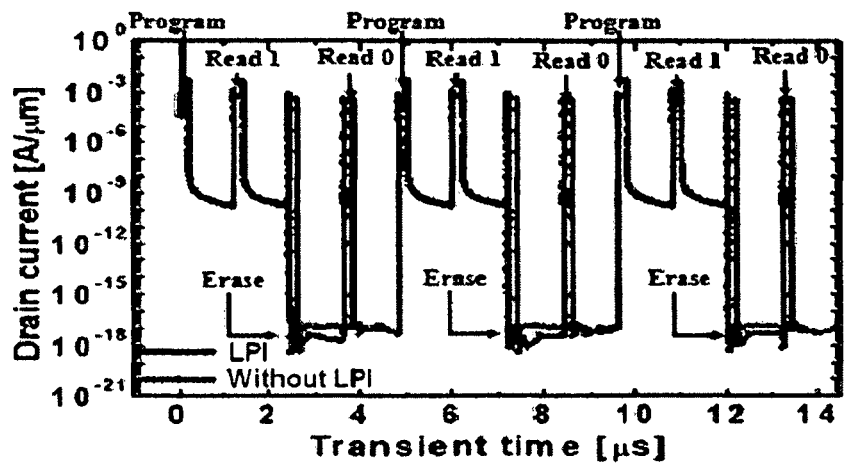
FIG. 5 is an electrical characteristic diagram illustrating a memory operation performed three times with the structure of FIG. 3.
FIG. 6 is a voltage application table summarizing examples of operating voltages for obtaining the result of FIG. 5. The operating voltages may be changed a little based on this table.

FIG. 5 is an electrical characteristic diagram illustrating a memory operation performed three times with the structure of FIG. 3, and FIG. 6 is a voltage application table summarizing examples of operating voltages for obtaining the result of FIG. 5. In FIG. 6, the operating voltages may be changed a little based on the table.

Figure 7:
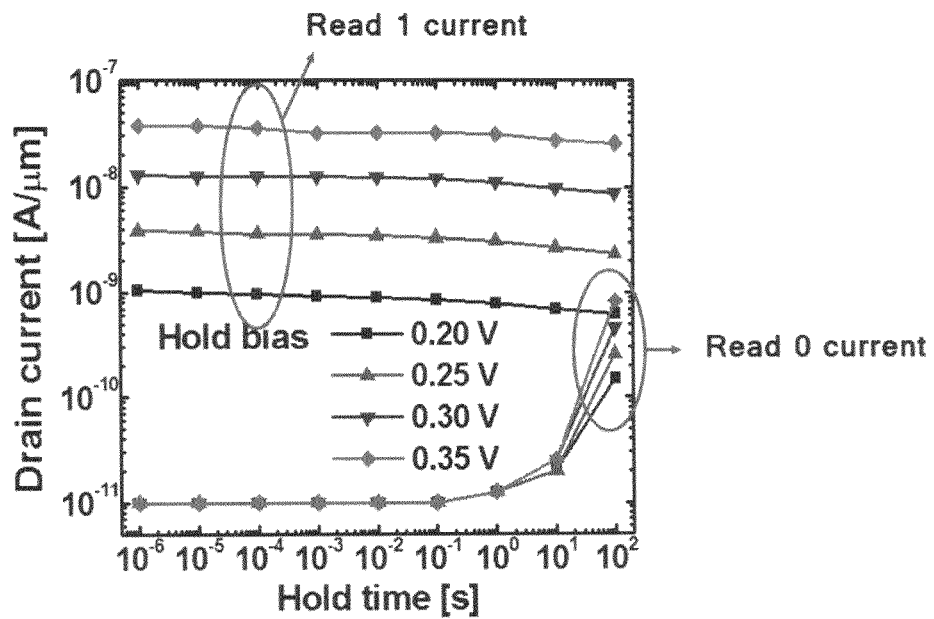
FIG. 7 is an electrical characteristic diagram showing the drain current change with time when the hold voltage of a second gate $V_{G2}$ of FIG. 6 is changed to 0.2 V, 0.25 V, 0.3 V, and 0.35 V for both state 1 and state 0 in the structure of FIG. 3.
Figure 8:
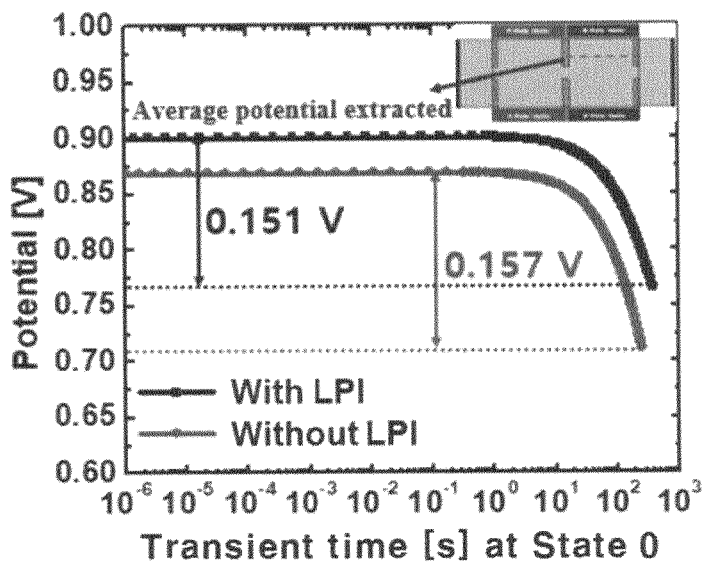
FIG. 8 is an electrical characteristic diagram showing the potential change of a body region surrounded by a second gate $V_{G2}$ when a hold voltage is applied in the cases that the partial insulation layer is provided with (with LPI) and without (Without LPI) at a state 0 (zero) erased in the structure of FIG. 3.

FIG. 7 is an electrical characteristic diagram showing the drain current change with time when the hold voltage of a second gate $V_{G2}$ of FIG. 6 is changed to 0.2 V, 0.25 V, 0.3 V, and 0.35 V for both state 1 and state 0 in the structure of FIG. 3, and FIG. 8 is an electrical characteristic diagram showing the potential change of a body region surrounded by a second gate $V_{G2}$ when a hold voltage is applied in the cases that the partial insulation layer is provided with (with LPI) and without (Without LPI) at a state 0 (zero) erased in the structure of FIG. 3.

From FIGS. 7 and 8, it is seen that the retention time in the embodiment having the partial insulating layers (With LPI) in the structure of FIG. 3 reaches several hundred seconds if an appropriate hold voltage is applied.

As mentioned above, although preferred embodiments of the present invention are described with reference to accompanying drawings, it is understood that the accompanying drawings are shown as a means for describing various embodiments of the present invention. Accordingly, embodiments of the present invention are not limited to the specific structures or electrical characteristics shown in the accompanying drawings.

This work was supported by the Korean Ministry of Trade, Industry and Energy (MOTIE) through the Korea Semiconductor Research Consortium (KSRC) Support Program for the development of the future semiconductor devices under Grant 10080513.

What is claimed is:

1. A 1T DRAM device comprising:
   source and drain regions;
   a body region having two or more doped semiconductor layers connected by a pn junction in a channel direction between the source and drain regions; and
   a plurality of gates formed on each of the doped semiconductor layers with a gate insulating layer interposed therebetween, wherein:
   the body region is further comprised of a body partial insulating layer allowing only a portion of the pn junction between the doped semiconductor layers.

2. The 1T DRAM device of claim 1, wherein a source partial insulating layer and a drain partial insulating layer are further formed between the source region and the body region and between the body region and the drain region, respectively, allowing only partial pn junctions.

3. The 1T DRAM device of claim 2, wherein the source region, the body region and the drain region are silicon, and the source partial insulating layer, the body partial insulating layer, and the drain partial insulating layer are a silicon oxide film having a thickness of 10 nm.

4. A 1T DRAM device comprising:
   source and drain regions;
   a body region having two or more doped semiconductor layers connected by a pn junction in a channel direction between the source and drain regions; and
   a plurality of gates formed on each of the doped semiconductor layers with a gate insulating layer interposed therebetween, wherein:
   the source region, the body region and the drain region are connected by at least three pn junctions along the channel direction, and
   the body region is further comprised of a body partial insulating layer allowing only a portion of the pn junction between the doped semiconductor layers.

5. The 1T DRAM device of claim 4, wherein the plurality of gates are placed electrically independent at both ends of each of the doped semiconductor layer of the body region.

6. The 1T DRAM device of claim 4, wherein a source partial insulating layer and a drain partial insulating layer are further formed between the source region and the body region and between the body region and the drain region, respectively, allowing only partial pn junctions.

7. The 1T DRAM device of claim 6, wherein the source region, the body region and the drain region are silicon, and the source partial insulating layer, the body partial insulating layer, and the drain partial insulating layer are a silicon oxide film having a thickness of 10 nm.

8. A 1T DRAM device comprising:
   source and drain regions;
   a body region having two or more doped semiconductor layers connected by a pn junction in a channel direction between the source and drain regions; and
   a plurality of gates formed on each of the doped semiconductor layers with a gate insulating layer interposed therebetween, wherein:
   the source region, the body region and the drain region are connected by at least three pn junctions along the channel direction,
   the plurality of gates surround the doped semiconductor layers of the body region, and
   the body region is further comprised of a body partial insulating layer allowing only a portion of the pn junction between the doped semiconductor layers.

9. The 1T DRAM device of claim 8, wherein a source partial insulating layer and a drain partial insulating layer are further formed between the source region and the body region and between the body region and the drain region, respectively, allowing only partial pn junctions.

10. The 1T DRAM device of claim 9, wherein the source region, the body region and the drain region are silicon, and the source partial insulating layer, the body partial insulating layer, and the drain partial insulating layer are a silicon oxide film having a thickness of 10 nm.

11. A 1T DRAM device comprising:
    source and drain regions;
    two or more body regions separated by a body partial insulating layer along a channel direction between the source and drain regions; and
    a plurality of gates formed on each of the separated body regions, respectively with a gate insulating layer interposed therebetween.

12. The 1T DRAM device of claim 11, wherein a source partial insulating layer and a drain partial insulating layer are further formed between the source region and the body region and between the body region and the drain region, respectively.

13. The 1T DRAM device of claim 11, wherein the source region is a doped semiconductor layer of a first conductivity type, the drain region is a doped semiconductor layer of a second conductivity type opposite to the source region, and the body region is an intrinsic semiconductor layer or a doped semiconductor layer of the same conductivity type as the drain region.

14. The 1T DRAM device of claim 13, wherein the plurality of gates surround each of the separated body regions.

15. The 1T DRAM device of claim 14, wherein, among the plurality of gates, a source side gate adjacent to the source region is doped with impurities of the same type as the drain region, and a drain side gate adjacent to the drain region is doped with impurities of the same type as the source region.

16. The 1T DRAM device of claim 12, wherein the source region is a doped semiconductor layer of a first conductivity type, the drain region is a doped semiconductor layer of a second conductivity type opposite to the source region, and the body region is an intrinsic semiconductor layer or a doped semiconductor layer of the same conductivity type as the drain region.

17. The 1T DRAM device of claim 16, wherein the plurality of gates surround each of the separated body regions.

* * * * *